US011860387B2

(12) United States Patent
Tatum et al.

(10) Patent No.: US 11,860,387 B2
(45) Date of Patent: Jan. 2, 2024

(54) LIGHT SOURCES WITH CHIP-LEVEL INTEGRATED DIFFUSERS

(71) Applicant: II-VI Delaware, Inc., Wilmington, DE (US)

(72) Inventors: Jimmy A. Tatum, Plano, TX (US); James K. Guenter, Garland, TX (US)

(73) Assignee: II-VI DELAWARE, INC., Wilmington, DE (US)

(*) Notice: Subject to any disclaimer, the term of this patent is extended or adjusted under 35 U.S.C. 154(b) by 0 days.

(21) Appl. No.: 17/661,957

(22) Filed: May 4, 2022

(65) Prior Publication Data

US 2022/0260761 A1   Aug. 18, 2022

Related U.S. Application Data

(63) Continuation of application No. 16/884,329, filed on May 27, 2020, now Pat. No. 11,353,634, which is a continuation of application No. 15/867,546, filed on Jan. 10, 2018, now Pat. No. 10,714,892.

(60) Provisional application No. 62/444,607, filed on Jan. 10, 2017.

(51) Int. Cl.
| | |
|---|---|
| *G02B 5/02* | (2006.01) |
| *G02B 27/09* | (2006.01) |
| *G02B 3/00* | (2006.01) |
| *H01S 5/0236* | (2021.01) |
| *H01S 5/026* | (2006.01) |

(Continued)

(52) U.S. Cl.
CPC ............ *G02B 5/021* (2013.01); *G02B 3/0043* (2013.01); *G02B 27/0905* (2013.01); *G02B 27/0927* (2013.01); *G02B 27/0961* (2013.01); *H01S 5/026* (2013.01); *H01S 5/0236* (2021.01); *H01S 5/183* (2013.01); *H01S 5/18391* (2013.01); *H01S 5/423* (2013.01); *G02B 27/0944* (2013.01)

(58) Field of Classification Search
CPC ........ G02B 5/02; G02B 5/021; G02B 5/0221; G02B 5/0257; G02B 5/0263
See application file for complete search history.

(56) References Cited

U.S. PATENT DOCUMENTS

| | | | |
|---|---|---|---|
| 7,294,863 B2 | 11/2007 | Lee et al. | |
| 8,783,893 B1 * | 7/2014 | Seurin | H01S 5/02345 362/157 |
| 10,295,145 B2 | 5/2019 | MacKinnon et al. | |

(Continued)

OTHER PUBLICATIONS

Martinsson et al., "Monolithic Integration of Vertical-Cavity Surface-Emitting Laser and Diffractive Optical Element for Advanced Beam Shaping," IEEE Photonics Technology Letters 11(5):503-505, May 1999.

(Continued)

*Primary Examiner* — Robert E. Tallman
(74) *Attorney, Agent, or Firm* — Blank Rome LLP

(57) ABSTRACT

An embodiment includes a light source. The light source may include a substrate and a diffuser. The substrate may include a first surface and a second surface. The second surface may be opposite the first surface. The diffuser may be carried by the substrate. The diffuser may be configured to receive an optical signal from the substrate after the optical signal propagates through the substrate and to control a particular profile of a resultant beam of the optical signal over two axes after the optical signal propagates through the integrated diffuser.

22 Claims, 16 Drawing Sheets

(51) Int. Cl.
*H01S 5/42* (2006.01)
*H01S 5/183* (2006.01)

(56) References Cited

U.S. PATENT DOCUMENTS

2010/0157609 A1 6/2010 Wu et al.
2016/0164261 A1 6/2016 Warren

OTHER PUBLICATIONS

Sales el al., "Deterministic Microlens Diffuser for Lambertian scatter," SPIE 2006 Annual Meeting, San Diego, Aug. 30, 2006, 19 pages.
Sayyah et al., "Two-dimensional pseudo-random optical phased array based on tandem optical injection locking of vertical cavity surface emitting lasers," Optics Express 23(15), Jul. 2015, 12 pages.
U.S. Appl. No. 15/867,546, filed Jan. 10, 2018.

* cited by examiner

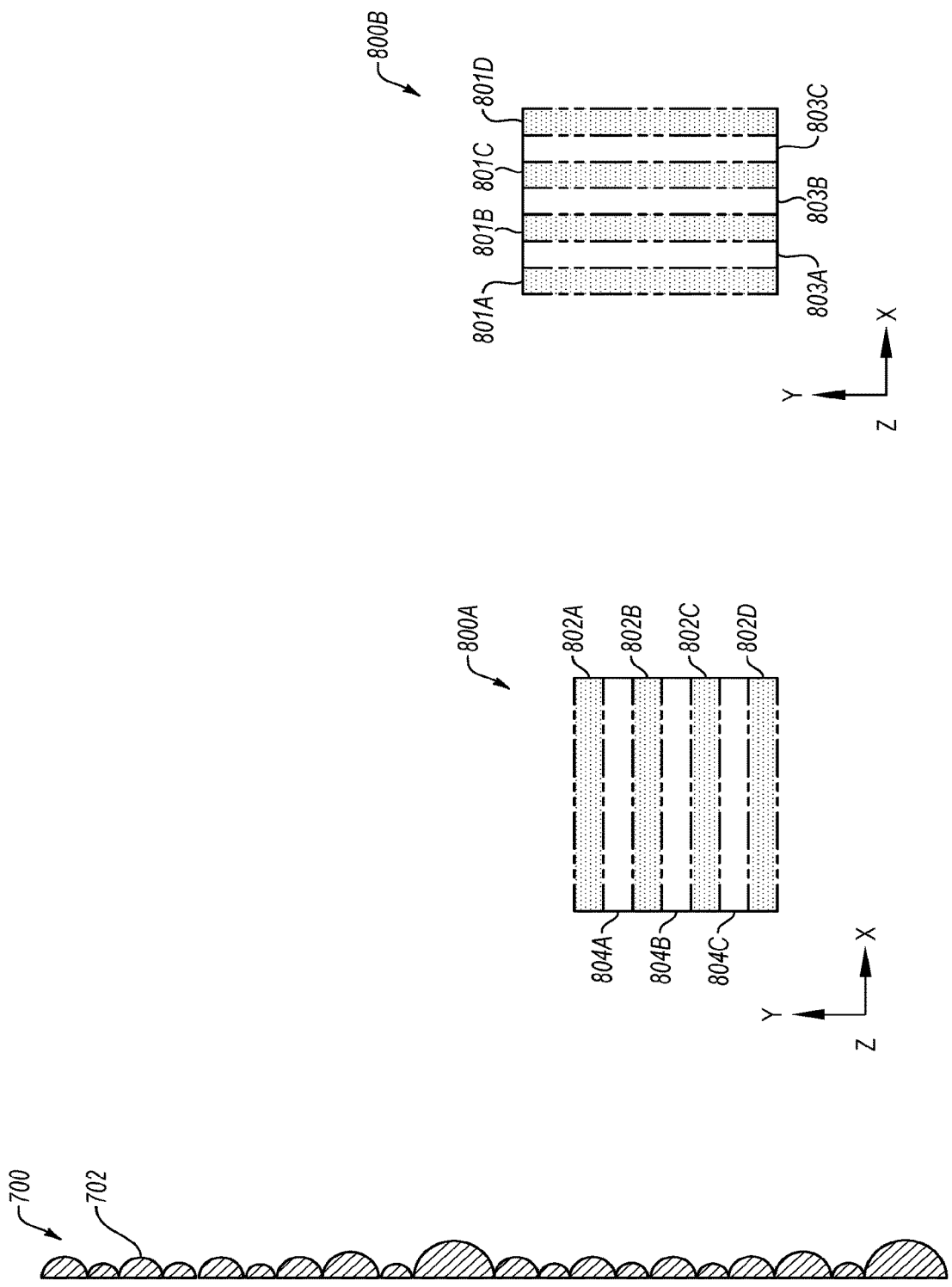

LIGHT SOURCES WITH CHIP-LEVEL INTEGRATED DIFFUSERS

CROSS-REFERENCE TO RELATED APPLICATIONS

This application is a continuation of U.S. application Ser. No. 16/884,329, filed May 27, 2020, which is a continuation of U.S. application Ser. No. 15/867,546 filed on Jan. 10, 2018 and claims priority to and the benefit of U.S. Provisional Application No. 62/444,607 filed on Jan. 10, 2017. The contents of these applications are incorporated herein by reference in their entirety.

FIELD

The embodiments discussed in the present disclosure are related to light sources with chip-level integrated diffusers.

BACKGROUND

Unless otherwise indicated herein, the materials described herein are not prior art to the claims in the present application and are not admitted to be prior art by inclusion in this section.

Some illumination functions benefit from a light source that is substantially uniform in its profile. For example, a user may want to engineer the profile to be 30 degrees divergent in the horizontal direction and 50 degrees in the vertical direction so a rectangular area is illuminated in the far field. Light sources implemented in such illumination functions may include a diffuser or an engineered diffuser. The diffuser may control divergence of the profile of the light source. However, in these light sources the diffuser or the engineered diffuser is included in a package at some distance away from an optical source. Accordingly, including the diffusers in these light sources involves package-level integration and costs associated with the package integration.

The subject matter claimed herein is not limited to implementations that solve any disadvantages or that operate only in environments such as those described above. Rather, this background is only provided to illustrate one example technology area where some implementations described herein may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

In one embodiment, a light source includes a substrate including a first surface and a second surface positioned opposite the first surface. The light source also includes an epitaxy layer positioned on the first surface of the substrate, an optical element formed in the epitaxy layer, the optical element positioned such that an optical signal transmitted thereby is directed toward the substrate, and a diffuser configured to receive the optical signal and to control a particular profile of a resultant beam of the optical signal after the optical signal propagates through the diffuser. The diffuser includes a plurality of lenslets carried by the substrate, and one or more of the lenslets is refractive or diffractive.

In another embodiment, a light source includes a substrate including a first surface and a second surface positioned opposite of the first surface and being configured for an optical signal to pass therethrough. The light source also includes a diffuser configured to receive an optical signal and to control a particular profile of a resultant beam of the optical signal over two axes after the optical signal propagates through the diffuser. The diffuser is carried by the substrate and includes a plurality of lenslets pseudo-randomly arranged relative to one another.

In another embodiment, a method includes growing an epitaxy layer on a first surface of a substrate, the substrate including the first surface and a second surface positioned opposite the first surface. The method also includes forming an optical element in the epitaxy layer such that an optical signal transmitted by the optical element is directed toward the substrate, and pseudorandomly arranging a plurality of lenslets on the substrate. The plurality of lenslets are configured to receive the optical signal transmitted by the optical element and to control a particular profile of a resultant beam of the optical signal after the optical signal propagates through the lenslets.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 7 depicts an example integrated diffuser polymer;

FIGS. 8A-8H illustrate example particular profiles;

DETAILED DESCRIPTION

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

Figure 1:
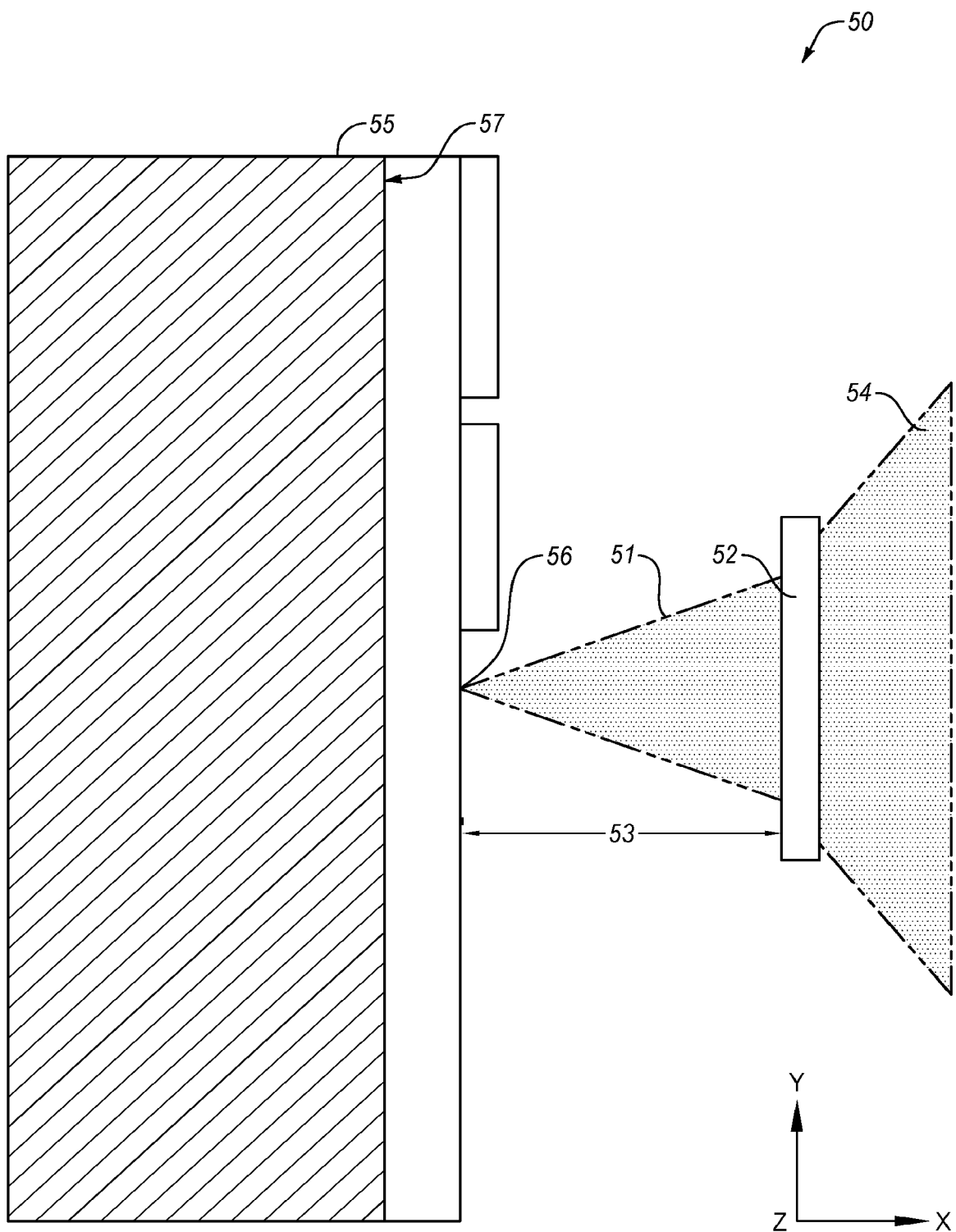
FIG. 1 is a block diagram of a light source.

FIG. 1 is a block diagram of an example light source 50 that may be configured for one or more illumination functions. The light source 50 may include an optical element 56 that transmits an optical signal 51. The optical signal 51 may propagate to a diffuser 52. As the optical signal 51 propagates to the diffuser 52, the optical signal 51 may diverge. As the optical signal 51 diverges, it may have a substantially uniform cross-sectional area. The uniform cross-sectional area (e.g., circular) may be substantially parallel to the YZ-plane of the arbitrarily-defined coordinate system of FIG. 1.

To modify the optical signal 51 from the substantially uniform profile to another particular profile, the diffuser 52 may be placed at some distance 53 from the optical element 56. The diffuser 52 may include a piece of plastic or a piece of glass that is configured to receive the optical signal 51 having the substantially uniform profile and change it to another profile. The diffuser 52 may be configured to change the profile of the optical signal 51 from the substantially uniform profile to another profile. For instance, a resultant beam 54 exiting the diffuser 52 may have a particular profile in the far field such as 30 degrees divergent in the horizontal direction (e.g., x-direction) and 50 degrees in the vertical direction (e.g., y-direction) or another particular profile.

The diffuser 52 in the light source 50 is added at the distance 53 from the optical element 56. Accordingly, the addition of the diffuser 52 may be a package-level addition to the light source 50. For example, an exterior shell or package may be configured to receive a substrate 55 and the optical element 56 as an integrated component. The diffuser 52 may then be added to the package. For example, the shell or the package may include a ceramic package. The diffuser 52 may be adhered to a top surface of the ceramic package.

Package-level additions may refer to multiple components that are separate structures and that are installed in a package relative to one another. For example, the light source 50 includes two package-level components: the diffuser 52 and the substrate 55 with the optical element 56. The substrate 55 and the optical element 56 may be referred to as integrated at a chip level, which may also be referred to as wafer-level integration.

For example, the wafer-level integration indicates that the optical element 56 and the substrate 55 are formed using wafer-level process that forms the optical element 56 and the substrate 55 into a single chip structure. The diffuser 52 is not included in the chip structure with the optical element 56 and the substrate 55 and not installed relative to the optical element 56 and the substrate 55 using a wafer-level process.

In some embodiments, a portion of the optical signal 51 may be transmitted through the substrate 55. In these and other embodiments, the optical element 56 may be positioned at a surface of the substrate 55 opposite a surface 57. The optical signal 51 may then propagate through the substrate 55, exit the substrate 55, and propagate through the diffuser 52. In these embodiments, the diffuser 52 may be separated from the substrate 55 by the distance 53 and operate as described above.

Figure 2A:
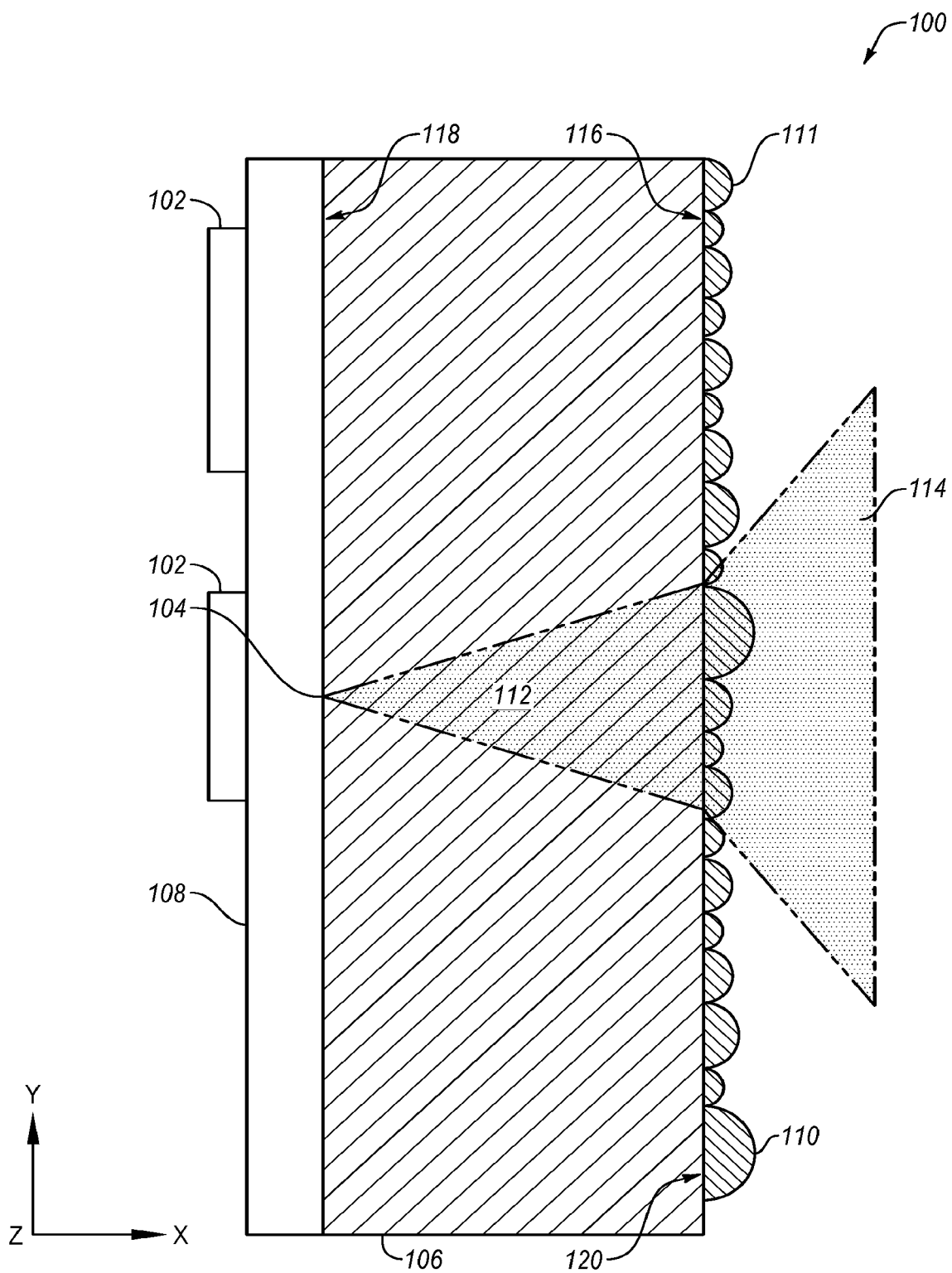
FIG. 2A illustrates a block diagram of an example light source.
Figure 2B:
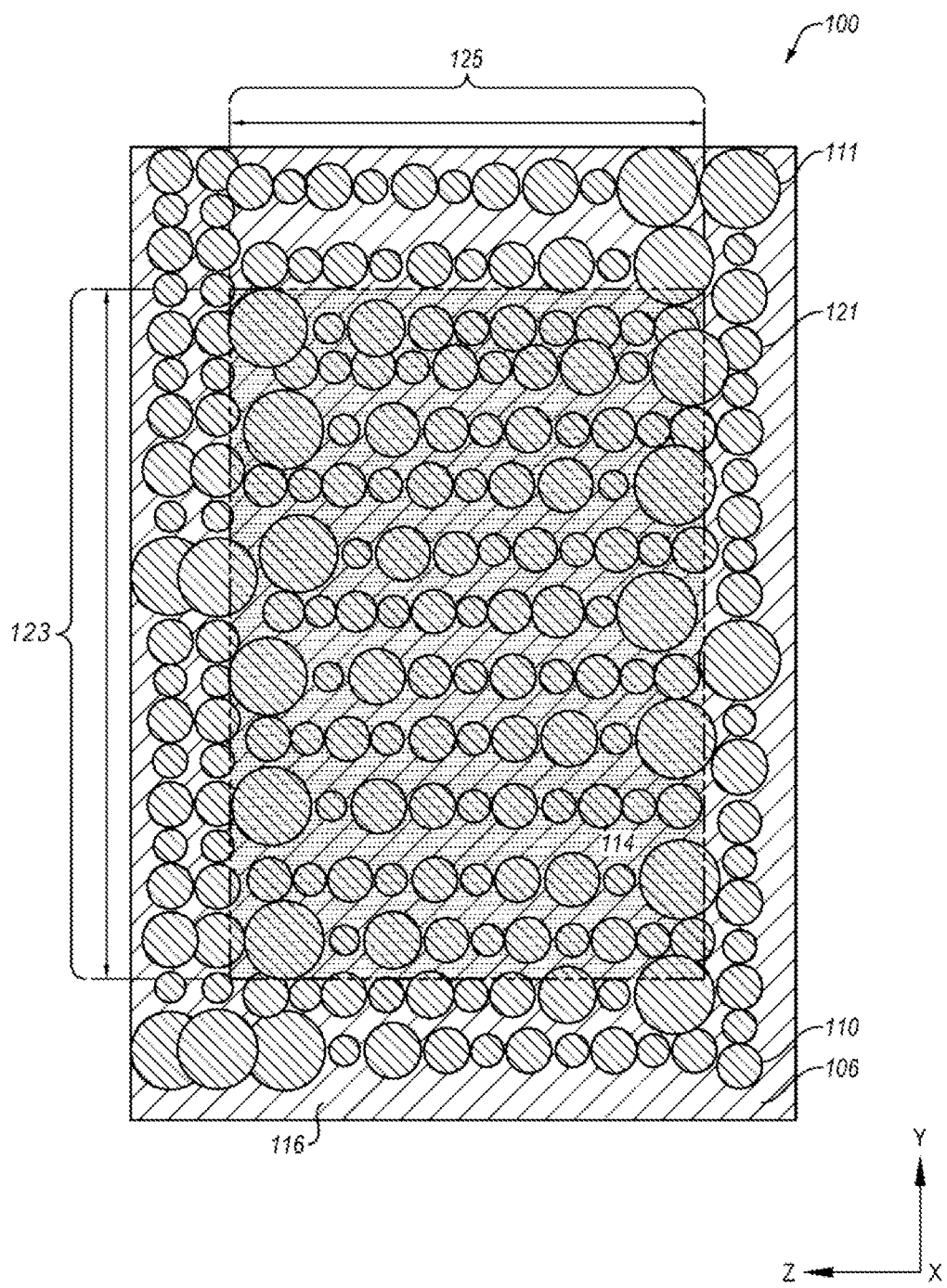
FIG. 2B illustrates another block diagram of the light source of FIG. 2A.
Figure 2C:
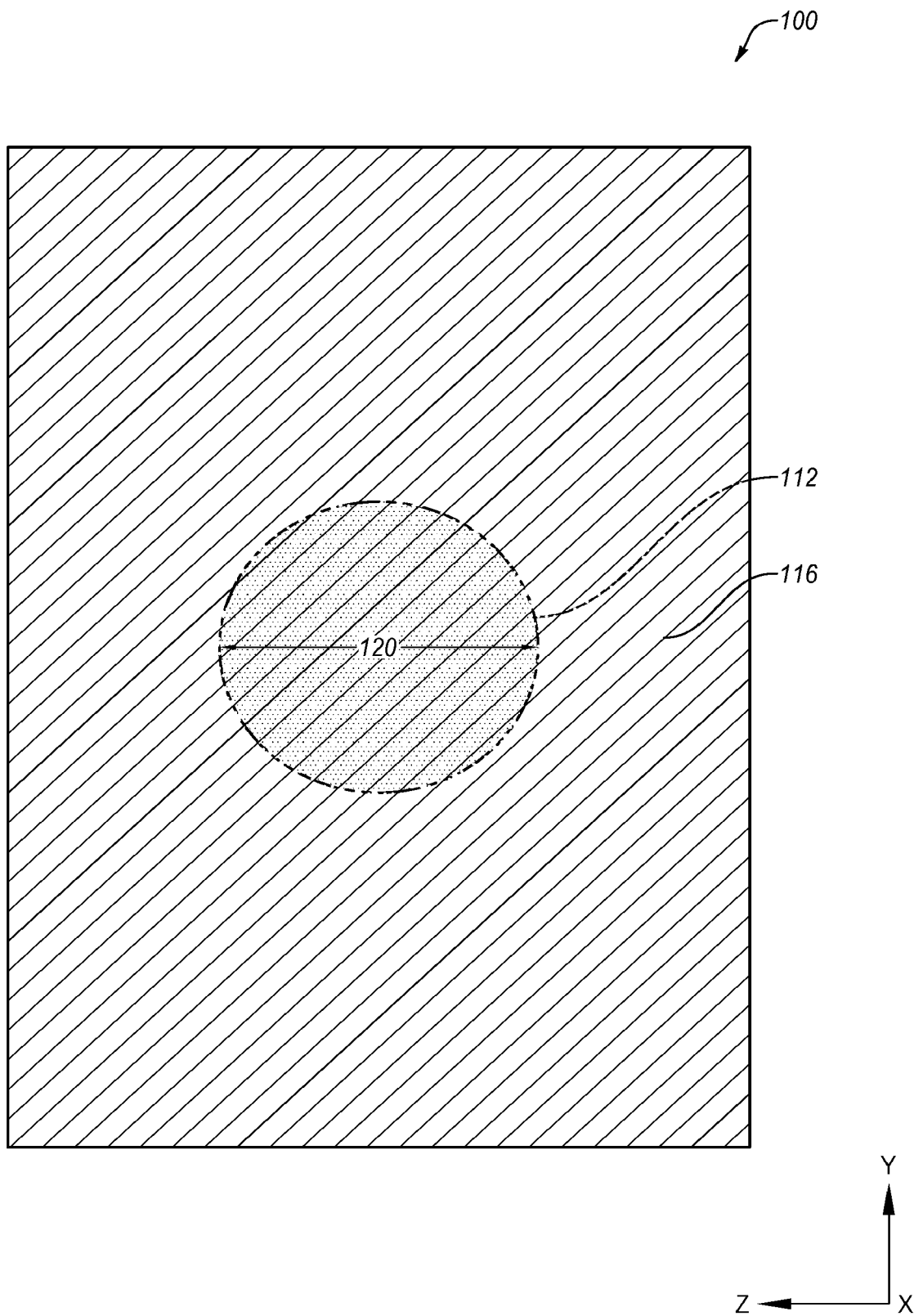
FIG. 2C illustrates another block diagram of the light source of FIGS. 2A and 2B.

FIGS. 2A-2C illustrate block diagrams of an example light source 100. The light source 100 includes an integrated diffuser 110. The integrated diffuser 110 may be positioned on a second surface 116 of a substrate 106 and integrated at a chip-level with the substrate 106 and an optical element 104. FIG. 2A depicts a side-sectional view of the light source 100. FIG. 2B depicts a front view of the light source 100. FIG. 2C depicts another front view of the light source 100 at the second surface 116.

With reference to FIG. 2A, the light source 100 may be an example of a back-side emitting light source. In back-side emitting light sources, the optical element 104 may be positioned on a first surface 118 of the substrate 106. The optical element 104 may be configured to transmit an optical signal 112 such that the optical signal 112 propagates through the substrate 106. In FIG. 2A, the optical signal 112 is transmitted in the positive x-direction of the arbitrarily-defined coordinate system of FIG. 2A.

The optical element 104 may be formed in an epitaxy layer 108. The epitaxy layer 108 may be formed on the first surface 118. Additionally, one or more contacts 102 may be formed on the epitaxy layer 108 through which electrical signals may be communicated to the optical element 104.

In the depicted embodiment, the optical element 104 includes a back-side emitting optical source. For instance, the optical element 104 may include a substrate-emitting vertical-cavity surface-emitting laser (VCSEL), which may be formed in the epitaxy layer 108 on the first surface 118.

In some embodiments, the optical element 104 may include an array of VCSELs. The array of VCSELs may include multiple, individual VCSELs that are arranged to transmit the optical signal 112. The number of VCSELs may be based on a particular application in which the light source 100 is included. For instance, in some embodiments, the array of VCSELs may include many hundreds (e.g., one thousand or more) of the VCSELs.

In these and other embodiments, the VCSELS of the array of VCSELs may be arranged in a pattern. The pattern of the VCSELS may be repetitive and/or may be arranged in a pattern that is symmetric about at least one axis. For example, in FIGS. 2A and 2B, the VCSELs in the array of VCSELs may be arranged in a rectangular pattern that is symmetric about axes that are substantially parallel to the x-axis and/or the y-axis. Alternatively, in these and other embodiments, the VCSELs of the array of VCSELs may be arranged in a non-repeating and/or non-symmetric pattern. For example, the VCSELs may be arranged in a random pattern or a pseudo-random pattern.

The optical signal 112 is generated by the optical element 104. The optical element 104 may be configured such that the optical signal 112 propagates through the substrate 106 (e.g., from the first surface 118 to the second surface 116). As the optical signal 112 propagates through the substrate 106, dimensions of the optical signal 112 may change. For instance, in the depicted embodiment, a diameter or a dimension in the y direction of the optical signal 112 may increase as the optical signal 112 propagates through the substrate 106.

The optical signal 112 may exit the substrate 106 at the second surface 116. The integrated diffuser 110 may be positioned directly on the second surface 116. For example, a surface of the integrated diffuser 110 and the second surface 116 may be in direct physical contact with one another such that the optical signal 112 propagates directly from the substrate 106 to the integrated diffuser 110. Additionally or alternatively, the integrated diffuser 110 may be formed such that there is no distinction between the integrated diffuser 110 and the second surface 116 of the substrate 106. Accordingly, the optical signal 112 propagates through the integrated diffuser 110 after the optical signal 112 exits the substrate 106 at the second surface 116.

The integrated diffuser 110 is configured to control a particular profile 121 of a resultant beam 114 of the optical signal 112 after the optical signal 112 propagates through the integrated diffuser 110. Control of the particular profile of the resultant beam 114 may include diverging the optical signal 112, converging the optical signal 112, collimating of the optical signal 112, or some combinations thereof. Additionally, control of the particular profile of the resultant beam 114 may include control in two axes. For example, the particular profile of the resultant beam 114 may be controlled such that the particular profile includes a first dimension in a first direction that is aligned with a first of the two axes (e.g., the first direction may be parallel with the y-axis) and a second dimension in a second direction that is aligned with a second of the two axes (e.g., the second direction may be parallel to the z-axis).

The substrate 106 includes the first surface 118 and the second surface 116. The second surface 116 is opposite the first surface 118 in the embodiment of FIG. 2A. The substrate 106 may be comprised of various materials or combination of materials. The material(s) of the substrate 106 may dictate and/or may be selected to accommodate a wavelength of the optical signal 112.

For example, in some embodiments, the substrate 106 may be comprised of gallium arsenide (GaAs). A GaAs substrate may be suitable in embodiments in which the optical signal 112 has a wavelength within the infrared (IR) spectrum such as a wavelength greater than about 900 nanometers (nm) (e.g., about 940 nm). In other embodiments, the substrate 106 may be comprised of indium phosphide. In these and other embodiments, the wavelength of the optical signal 112 may be longer than the wavelengths of embodiments using GaAs substrates. In yet other embodiments, the substrate 106 may be comprised of gallium nitride, silicon carbide, or sapphire. In these and other embodiments, the optical signal 112 may have a wavelength that may be in a blue spectrum. In yet other embodiments, the optical signal 112 may have a wavelength of about 1300 nm.

The integrated diffuser 110 may include lenslets 111. In FIGS. 2A-2C, only one of the lenslets 111 is labelled. The lenslets 111 are configured to provide the particular profile of the resultant beam 114. For example, one or more characteristics of the lenslets 111 and the arrangement of the lenslets 111 on the second surface 116 can be determined such that the particular profile results.

The lenslets 111 may be positioned at multiple locations on the second surface 116. The lenslets 111 may include one or more lenslets that are refractive. Additionally, the lenslets 111 may include one or more lenslets that are diffractive. In some embodiments, the lenslets 111 may be positioned at pseudorandom locations on the second surface 116. Additionally or alternatively, the lenslets 111 may include two or more focal lengths. The two or more focal lengths of the lenslets 111 may be pseudorandom. For example, the lenslets 111 may include five individual lenslets, each of which may have a different focal length. The five individual lenslets may be positioned on the second surface 116 pseudorandomly. Accordingly, the pseudorandom positioning of the five individual lenslets having different focal lengths may result in the integrated diffuser 110 having in the aggregate a pseudorandom distribution on the second surface 116.

The lenslets 111 may also include one or more conical shapes and/or one or more cylindrical shapes. The conical shapes and/or the cylindrical shapes include a refraction that in the aggregate controls divergence of the resultant beam. Examples of the conical shapes may include cones, elliptical cones, cylinders (e.g., cone with an apex at infinity), domes, and the like.

The lenslets 111 may be arranged on the second surface 116 in a particular pattern and/or may be sized relative to the optical signal 112 at the second surface 116. The particular pattern may be repetitive or otherwise configured such that the optical element 104 need not be precisely aligned with the integrated diffuser 110. For example, in some light sources (e.g., the light source 50 of FIG. 1) an optical source may be precisely aligned with a lens, which may enable the lens to modify or focus light passing through the lens. Misalignment between the optical source and the lens may result in the light being poorly focused. However, the multiple lenslets 111 may not have to be precisely aligned. For instance, in embodiments in which the lenslets 111 are pseudorandomly positioned with pseudorandomly focal lengths may enable an imprecise alignment between the optical element 104 and the integrated diffuser 110.

FIG. 2C illustrates a block diagram of the light source 100 of FIG. 2A. In FIG. 2C, an end view of the light source 100 is depicted with the integrated diffuser 110 removed. Referring to FIGS. 2A and 2C, the lenslets 111 may be sized such that the optical signal 112 at the second surface 116 impinges multiple lenslets 111. In addition, a diameter 120 of the optical signal 112 at the second surface 116 may be sized to impinge multiple of lenslets 111 as it exits the substrate 106. For instance, in some embodiments, the lenslets 111 may include diameters in a range of about one-half micron to about five microns. The diameter 120 may be about thirty microns. Accordingly, the optical signals 112 may impinge at least about six lenslets 111 and up to about sixty lenslets 111. In other embodiments, the diameters of the lenslets 111 may be larger than five microns or smaller than one-half microns. Additionally, the optical signal 112 at the second surface 116 may be smaller than sixty microns or larger than sixty microns. In some embodiments, the lenslets 111, the substrate 106, and the optical signal 112 may be configured such that at least ten lenslets 111 are impinged by the optical signal 112 at the second surface 116.

Referring to FIG. 2B, the particular profile 121 of the resultant beam 114 may be controlled over two axes. For instance, with reference to FIGS. 2A-2C, the particular profile 121 of the resultant beam 114 may be controlled in a first direction 123 that is parallel to the y-axis and a second direction 125 that is parallel to the z-axis. For example, the lenslets 111 may be designed and arranged on the second surface 116 such that the particular profile 121 of the resultant beam 114 includes a first dimension along the first direction 123 and a second dimension in the second direction 125. The first dimension may differ from the second dimension. In other embodiments, the particular profile 121 may include other shapes. Some additional details of the other particular profiles are provided with reference to FIGS. 8A-8H.

In the depicted embodiment, the optical signal 112 at the second surface 116 may be substantially circular as depicted in FIG. 2C. As the optical signal 112 passes through the integrated diffuser 110, the particular profile 121 of the resultant beam 114 may be controlled such that the particular profile 121 is rectangular as depicted in FIG. 2B. In the depicted embodiment, the integrated diffuser 110 controls diversion of the optical signal 112 to result in the particular profile 121. In other embodiments, the integrated diffuser 110 may control conversion or collimation of the optical signal.

The integrated diffuser 110 may be implemented with the substrate 106 and the optical element 104 at the chip-level. For instance, integrated diffuser 110 is implemented directly on the substrate 106 such that the substrate 106, the epitaxy layer 108, and the optical element 104 are included in a single chip. The integrated diffuser 110, the substrate 106, the epitaxy layer 108, and the optical element 104 may be constructed using wafer-level integration processes.

Referring to FIGS. 1-2C, a benefit of the light source 100 of FIGS. 2A-2C compared to the light source 50 of FIG. 1 may include a reduction in costs associated with a second-level package integration. In addition, a benefit of the light source 100 compared to the light source 50 may include facilitation of integration of the light source 100 into various applications. For example, the light source 100 may be smaller and a single package that may enable the light source 100 to be more easily integrated into devices and applications.

Figure 3:
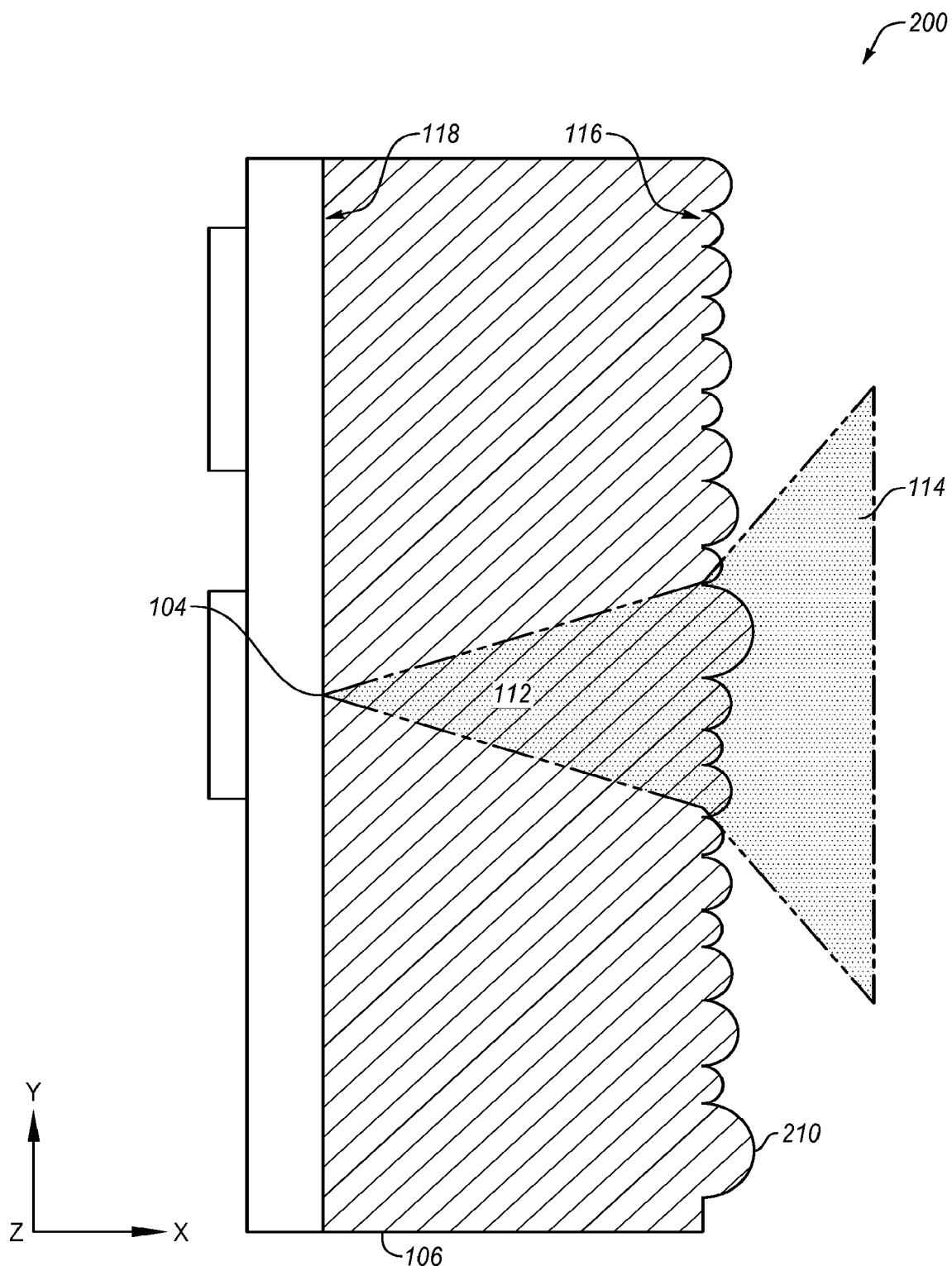
FIG. 3 illustrates a block diagram of another example light source.

FIG. 3 illustrates a block diagram of another example light source 200. The light source 200 includes the optical element 104 positioned on the first surface 118 of the substrate 106. The optical element 104 may be configured to transmit the optical signal 112 such that the optical signal 112 propagates through the substrate 106. The optical signal 112 exits the substrate 106 and directly enters an etched integrated diffuser 210. The etched integrated diffuser 210 is positioned directly on the second surface 116 and is configured to control the particular profile of the resultant beam 114 of the optical signal 112 as it exits the substrate 106 and propagates through the etched integrated diffuser 210.

In the embodiment of FIG. 3, the etched integrated diffuser 210 is etched directly into the second surface 116 of the substrate 106. For instance, the epitaxy layer 108 may be formed on the first surface 118 of the substrate 106 with the optical element 104 included therein. The etched integrated diffuser 210 (e.g., multiple lenslets 111) may then be etched into the substrate 106. The etched integrated diffuser 210 may operate substantially similarly to the integrated diffuser 110 described with reference to FIGS. 2A-2C. However, the integrated diffuser 210 is formed through one or more material removal processes applied to the second surface 116. The etched integrated diffuser 210 may include the lenslets 111 described above.

Figure 4:
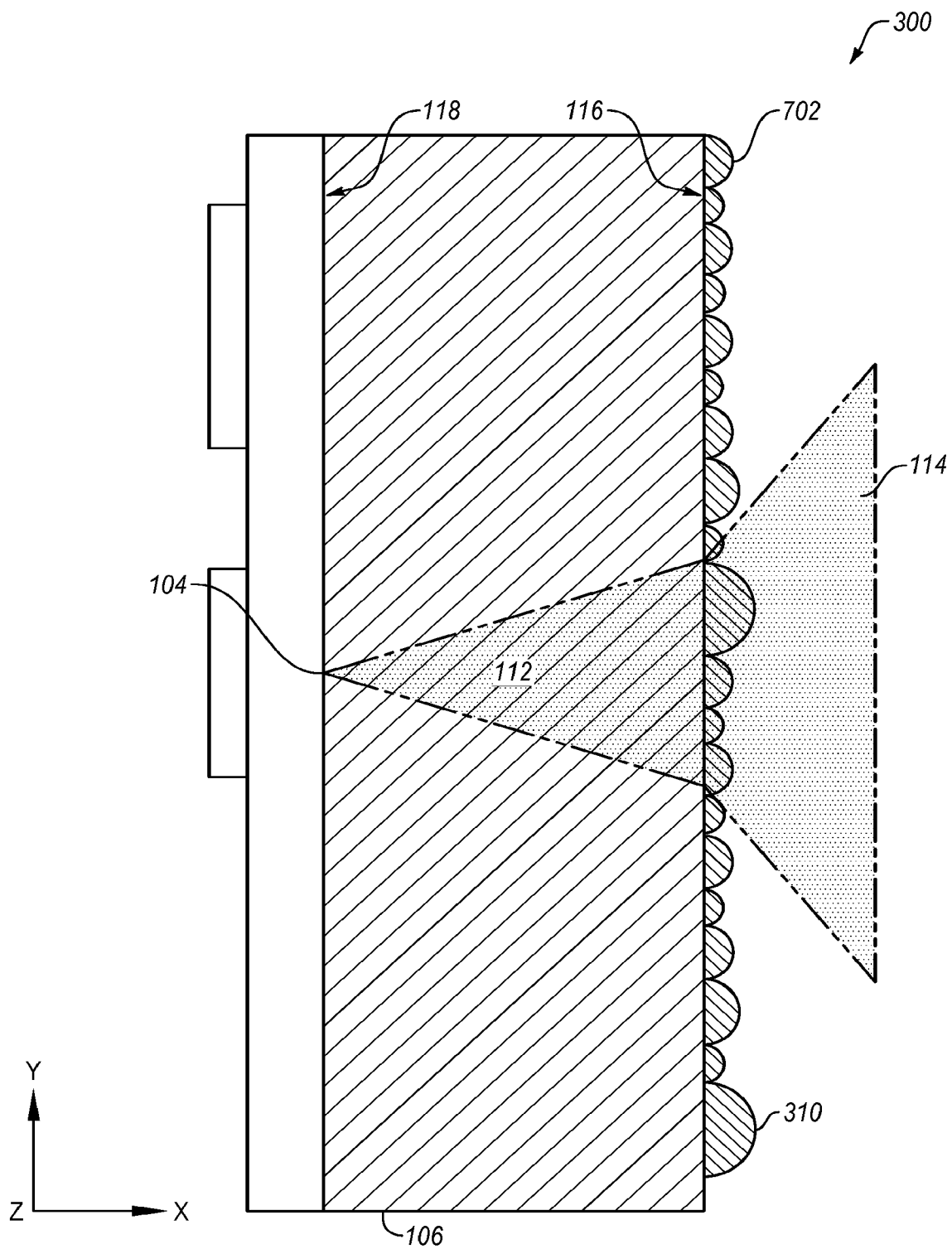
FIG. 4 illustrates a block diagram of another example light source.

FIG. 4 illustrates a block diagram of another example light source 300. The light source 300 includes the optical element 104 positioned on the first surface 118 of the substrate 106. The optical element 104 may be configured to transmit the optical signal 112 such that the optical signal 112 propagates through the substrate 106. The optical signal 112 exits the substrate 106 and directly enters a polymer integrated diffuser 310. The polymer integrated diffuser 310 is positioned directly on the second surface 116 and is configured to control the particular profile of the resultant beam 114 of the optical signal 112 as it exits the substrate 106 and propagates through the polymer integrated diffuser 310.

In the embodiment of FIG. 4, the polymer integrated diffuser 310 is formed on a polymer. The polymer integrated diffuser 310 is attached to the second surface 116 of the substrate 106. For example, FIG. 7 depicts an example integrated diffuser polymer ("polymer") 700. For instance, the epitaxy layer 108 may be formed on the first surface 118 of the substrate 106 with the optical element 104 included therein. The polymer integrated diffuser 310 may then be formed in the polymer 700 and attached onto the second surface 116 of the substrate 106. The integrated diffuser 310 may operate substantially similarly to the integrated diffusers 110 and 210 described with reference to FIGS. 2A-3. The polymer integrated diffuser 310 may include the lenslets 111 described above.

With combined reference to FIGS. 4 and 7, lenslets 702 may be formed in the polymer 700 either prior to or following attachment of the polymer 700 to the substrate 106. In FIGS. 4 and 7, only one of the lenslets 702 is labeled. The lenslets 702 are substantially similar to the lenslets 111 described with reference to FIGS. 2A-2C.

In some embodiments, the polymer integrated diffuser 310 is comprised of an ultra violet (UV) curable polymer. In these and other embodiments, the polymer integrated diffuser 310 is generated using a master UV stamp. Alternatively, in some embodiments, the polymer integrated diffuser 310 may be comprised of a thermoplastic. In these and other embodiments, the polymer integrated diffuser 310 may be generated using a heated stamp that melts a surface of the thermoplastic. Alternatively still, in some embodiments, the polymer integrated diffuser 310 may be generated using lithography.

Figure 5A:
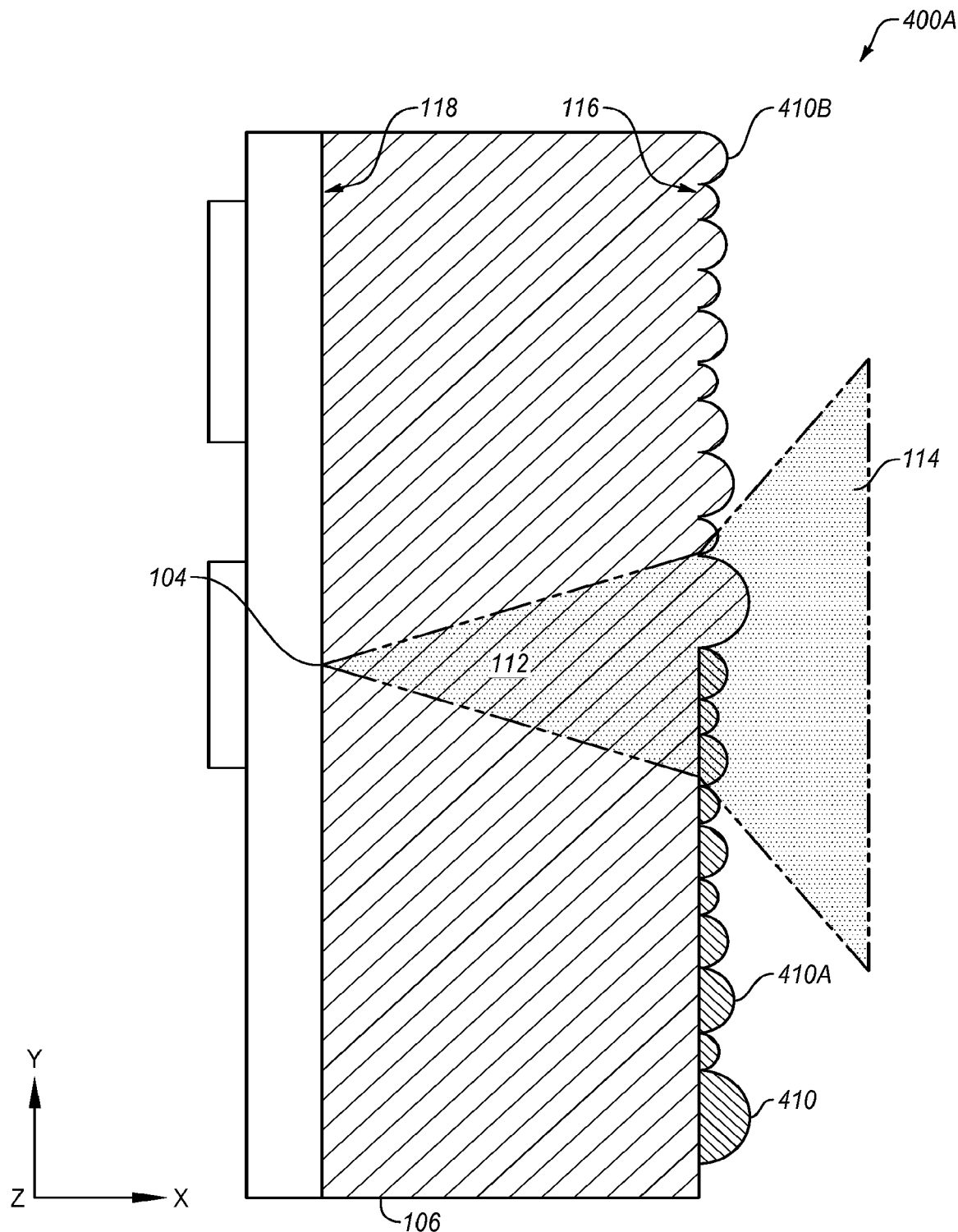
FIG. 5A illustrates a block diagram of another example light source.
Figure 5B:
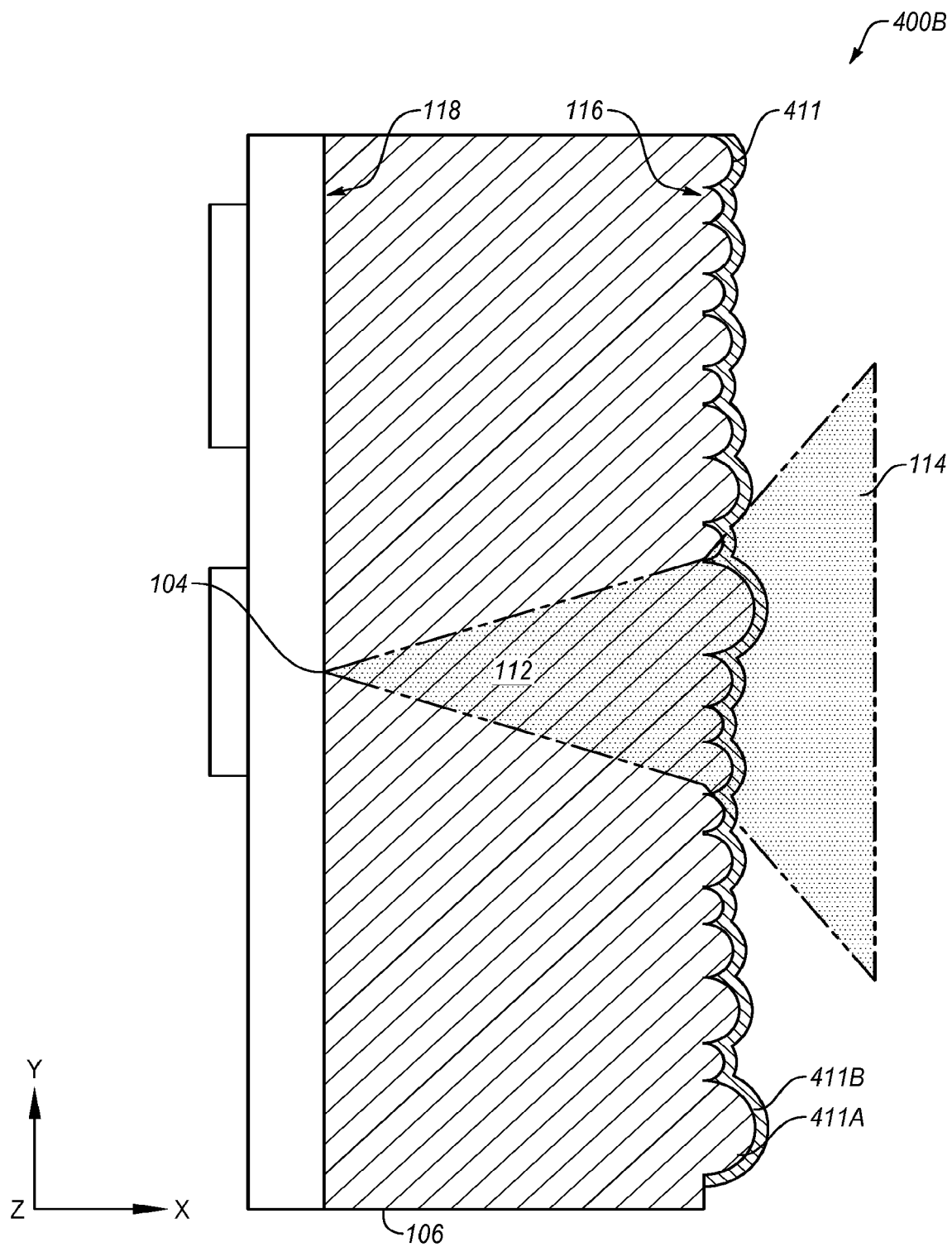
FIG. 5B illustrates a block diagram of another example light source.

FIGS. 5A and 5B illustrate a block diagrams of other example light sources 400A and 400B. The light sources 400A and 400B include the optical element 104 positioned on the first surface 118 of the substrate 106 that is configured to transmit the optical signal 112 such that the optical signal 112 propagates through the substrate 106. The light sources 400A and 400B of FIGS. 5A and 5B include mixed integrated diffusers 410 and 411 respectively. The mixed integrated diffusers 410 and 411 may be positioned on the second surface 116 and may be configured to control a particular profile of the resultant beam 114 of the optical signal 112 as it exits the substrate 106 and propagates through the mixed integrated diffusers 410 and 411. The mixed integrated diffusers 410 and 411 may operate substantially similarly to the integrated diffuser 110 described with reference to FIGS. 2A-2C.

In the embodiment of FIG. 5A, the mixed integrated diffuser 410 includes a first portion 410A and a second portion 410B. The first portion 410A of the integrated diffuser 410 is formed on a polymer (e.g., the polymer 700 described below) that is attached to the second surface 116 of the substrate 106. The second portion 410B of the mixed integrated diffuser 410 may be etched directly into the second surface 116 of the substrate 106.

In the embodiment of FIG. 5B, the integrated diffuser 411 includes a first portion 411A and a second portion 411B. The first portion 411A is etched directly into the second surface 116 of the substrate 106. The second portion 411B of the integrated diffuser 411 is formed on a polymer (e.g., 700) that is attached to the first portion 411A. For example, the second portion 411B may be overlaid on the first portion 411A. The first portion 411A and the second portion 411B may have complementary effects. For example, the first portion 411A may include a first shape providing diffusion in the z-direction and the second portion 411B may include a second shape providing diffusion in the y-direction. In these and other embodiments, the complementary effects may be at least partially due to the refractive index of the semiconductor material of the substrate 106 being high such that refraction occurs at the semiconductor-polymer interface between the first portion 411A and the second portion 411B, and then again at the polymer-air interface between the second portion 411B and a surrounding environment.

Figure 6A:
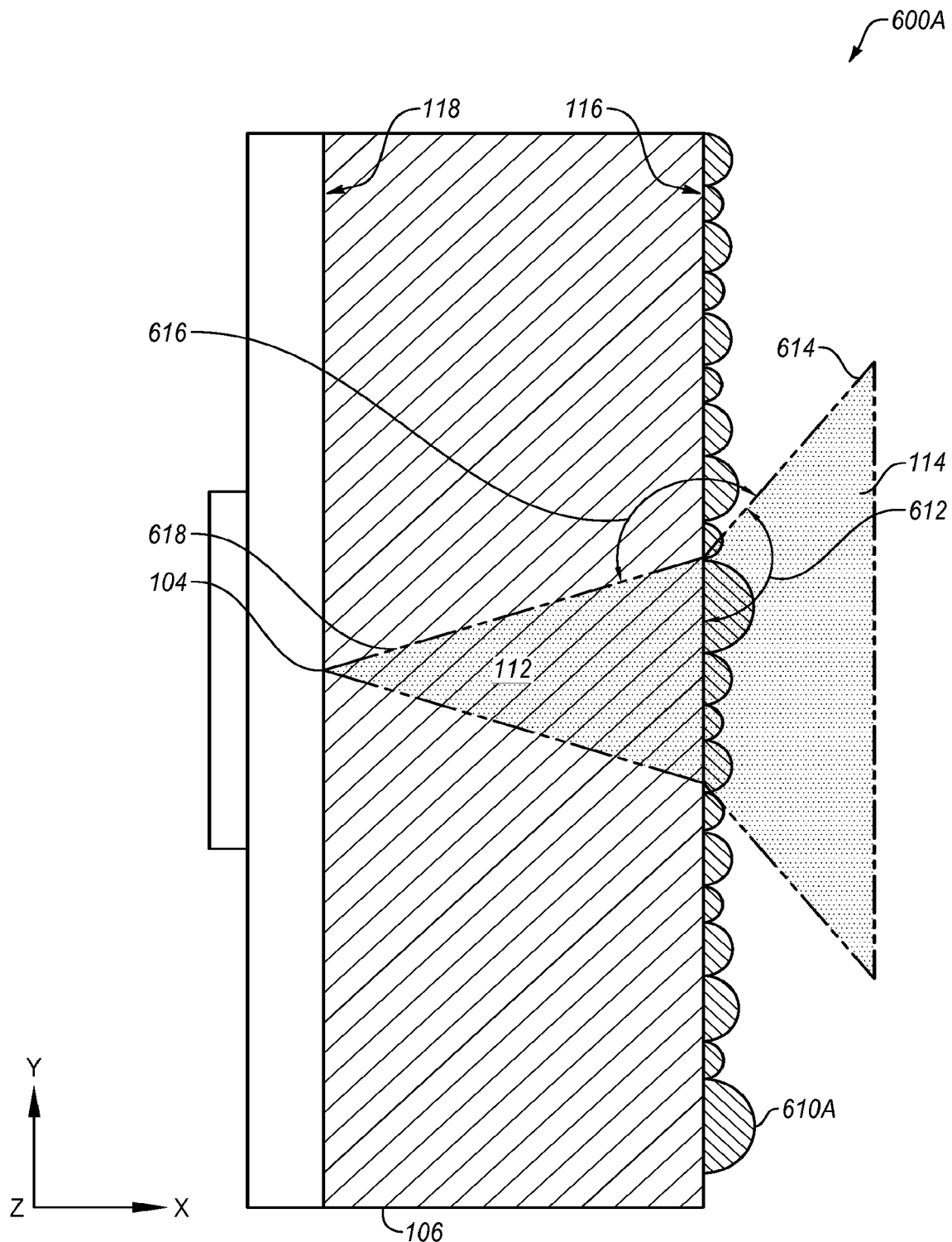
FIG. 6A illustrates a block diagram of another example light source.
Figure 6B:
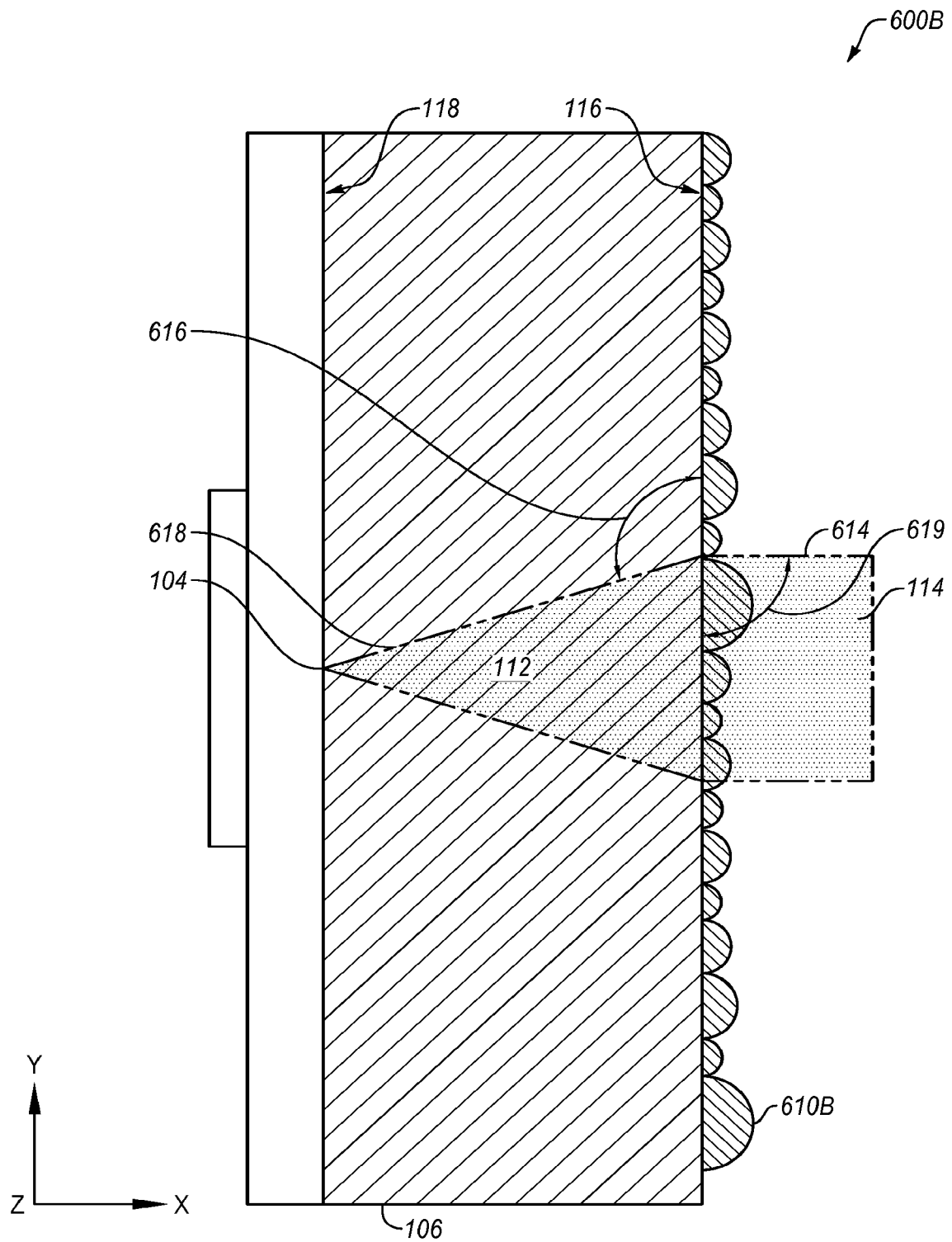
FIG. 6B illustrates a block diagram of another example light source.
Figure 6C:
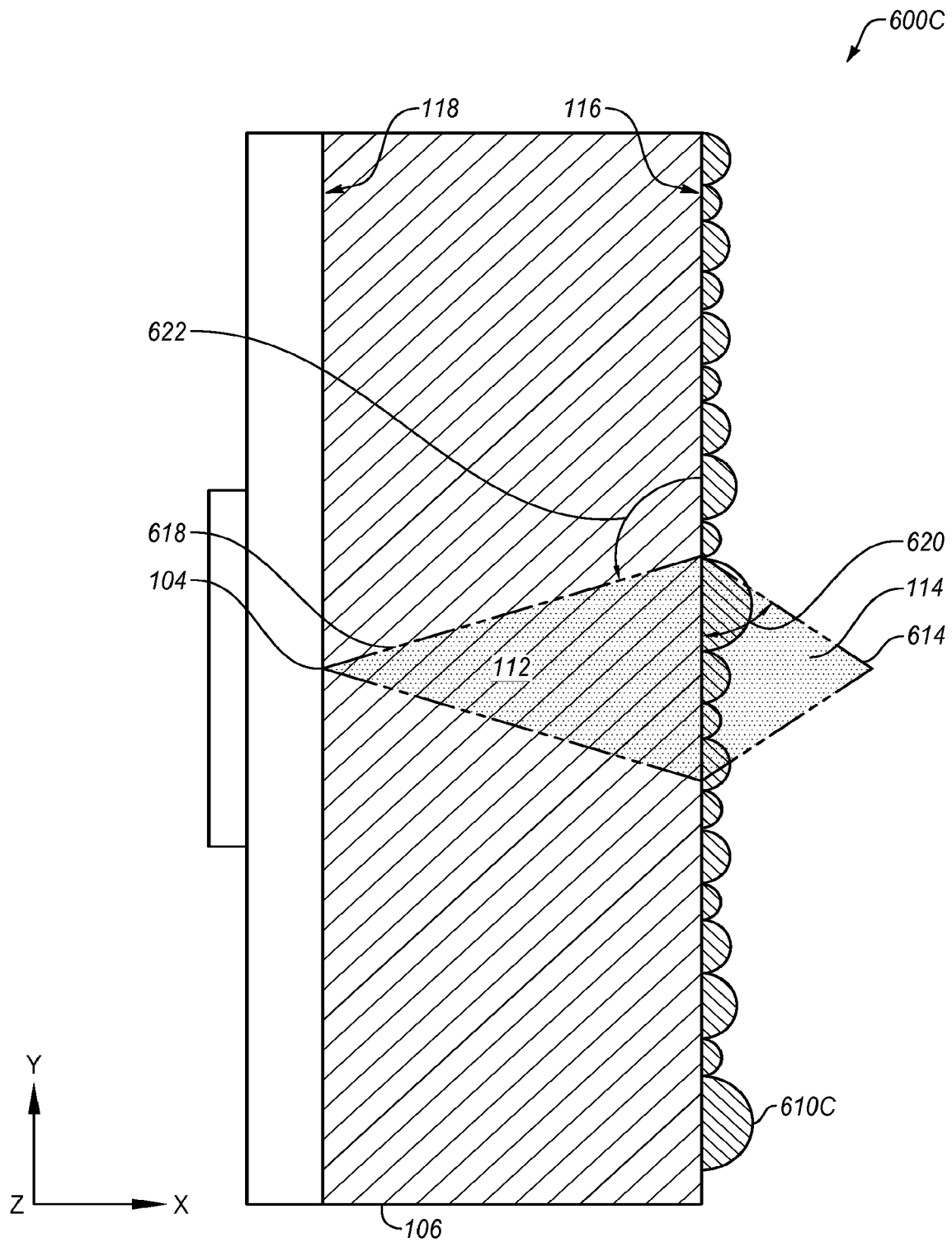
FIG. 6C illustrates a block diagram of another example light source.

FIGS. 6A-6C illustrate block diagrams of example light sources 600A-600C. The light sources 600A-600C include the optical element 104 positioned on the first surface 118 of the substrate 106. The optical element 104 may be configured to transmit the optical signal 112 such that the optical signal propagates through the substrate 106. The light sources 600A-600C of FIGS. 6A-6C include integrated diffusers 610A, 610B, 610C, respectively. The integrated diffusers 610A, 610B, 610C function substantially similarly to the integrated diffuser 110 described with reference to FIGS. 2A-2C. The integrated diffusers 610A, 610B, 610C may be constructed similarly to the etched integrated diffuser 210 of FIG. 3, the polymer integrated diffuser 310 of FIG. 4, or the mixed integrated diffusers 410 and 411 of FIGS. 5A and 5B.

The integrated diffusers 610A, 610B, 610C are positioned directly on the second surface 116 and are configured to control divergence or convergence of the resultant beam 114 of the optical signal 112 as it exits the substrate 106. In particular, a first integrated diffuser 610A of FIG. 6A may be configured to diverge the optical signal 112. For example, an angle 612 between an outer edge 614 of the resultant beam 114 and the second surface 116 may be greater than 90 degrees. Additionally, the angle 612 may be greater than an impingement angle 616 between an outer edge 618 of the optical signal 112 and the second surface 116. The angle 612 may range between about 90 degrees and about 180 degrees.

Referring to FIG. 6B, a second integrated diffuser 610B may be configured to project the optical signal 112. For example, an angle 619 between the outer edge 614 of the resultant beam 114 and the second surface 116 may be equal to 90 degrees.

Referring to FIG. 6C, a third integrated diffuser 610C may be configured to converge the optical signal 112. For example, an angle 620 between the outer edge 614 of the resultant beam 114 and the second surface 116 may be less than 90 degrees. Additionally, the angle 620 may be less than an impingement angle 622 between the outer edge 618 of the optical signal 112 and the second surface 116. The angle 620 may range between about 90 degrees and about 15 degrees.

FIGS. 8A-8H illustrate example particular profiles 800A-800H. The particular profiles 800A-800H may be generated by an integrated diffuser such as the integrated diffusers 110, 210, 310, 410, 411, and 610A-610C described elsewhere in the present disclosure. In the particular profiles 800A-800H the patterned portion indicates portions of the particular profiles 800A-800H that are illuminated. Each of the particular profiles 800A-800H is briefly described in the following paragraphs.

FIG. 8A includes a first particular profile 800A. The first particular profile 800A includes multiple horizontal lines 802A-802D that are separated by non-illuminated portions 804A-804C. The width (a dimension in the x-direction) of the horizontal lines 802A-802D, width (a dimension in the x-direction) of the non-illuminated portions 804A-804C, height (a dimension in the y-direction) of the horizontal lines 802A-802D, height of the non-illuminated portions 804A-804C, number of the non-illuminated portions 804A-804C, number of the horizontal lines 802A-802D, or any combination thereof may be determined by the integrated diffuser.

FIG. 8B includes a second particular profile 800B. The second particular profile 800B includes multiple vertical lines 801A-801D that are separated by non-illuminated portions 803A-803C. The width (a dimension in the x-direction) of the vertical lines 801A-801D, the width (a dimension in the x-direction) of the non-illuminated portions 803A-803C, the height (a dimension in the y-direction) of the vertical lines 801A-801D, the height of the non-illuminated portions 803A-803C, the number of the non-illuminated portions 803A-803C, the number of the vertical lines 801A-801D, or any combination thereof may be dictated by the arrangement and characteristics of an integrated diffuser.

Figure 8C:
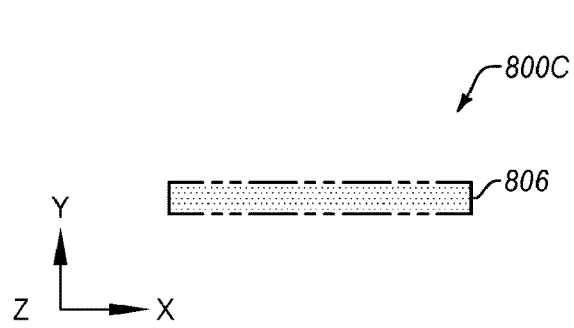
Figure 8D:
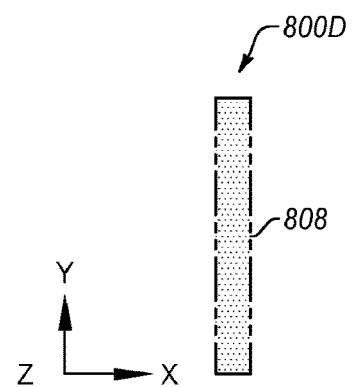

FIG. 8C includes a third particular profile 800C. The third particular profile 800C includes one horizontal line 806. A width (a dimension in the x-direction) of the horizontal line 806 and/or a height (a dimension in the y-direction) of the horizontal line 806 may be dictated by the arrangement and characteristics of an integrated diffuser. FIG. 8D includes a fourth particular profile 800D. The fourth particular profile 800D includes one vertical line 808. A width (a dimension in the x-direction) of the vertical line 808 and/or a height (a dimension in the y-direction) of the vertical line 808 may be dictated by the arrangement and characteristics of an integrated diffuser.

Figure 8E:
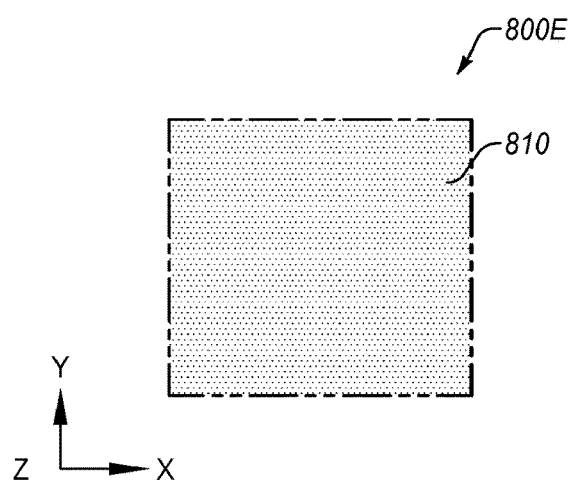

FIG. 8E includes a fifth particular profile 800E. The fifth particular profile 800E includes a rectangular block 810. A width (a dimension in the x-direction) of the rectangular block 810 and/or height (a dimension in the y-direction) of the rectangular block 810 may be dictated by the arrangement and characteristics of an integrated diffuser. For instance, the rectangular block 810 may change and include dimensions of the fourth or third particular profiles 800C and 800D.

Figure 8F:
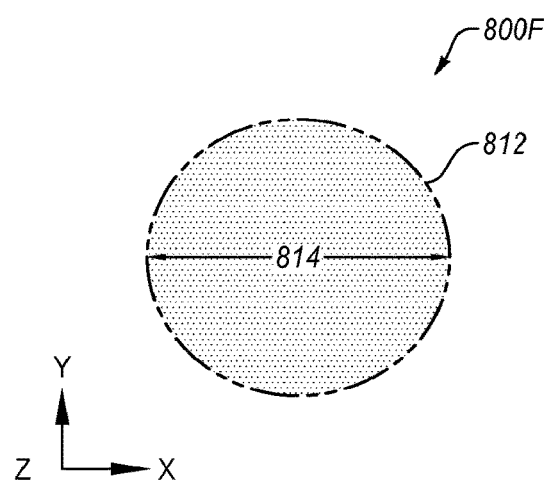
Figure 8G:
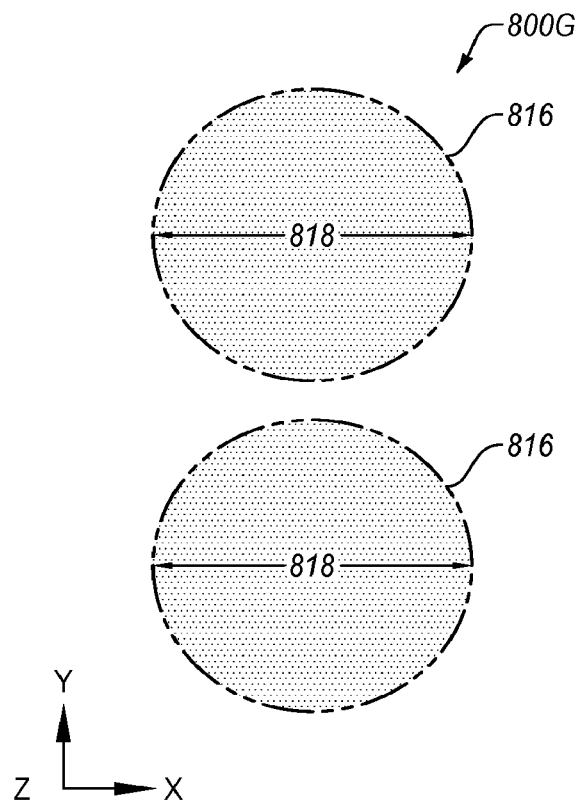
Figure 8H:
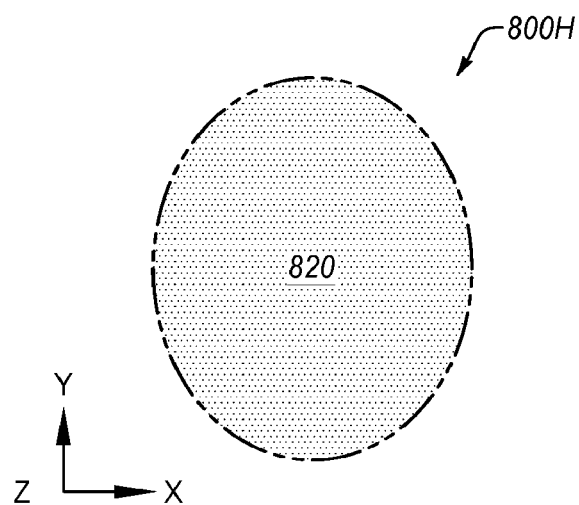

FIG. 8F includes a sixth particular profile 800F. The sixth particular profile 800F includes a circular profile 812. A diameter 814 of the circular profile 812 may be dictated by the arrangement and characteristics of an integrated diffuser. FIG. 8G includes a seventh particular profile 800G. The seventh particular profile 800G includes a multi-circular profile 816. One or both of the diameters 818 of the multi-circular profile 816 and/or the number of circles included in the multi-circular profile 816 may be dictated by the arrangement and characteristics of an integrated diffuser. For example, the multi-circular profile 816 may include two or more circles. FIG. 8H includes an eighth particular profile 800H. The eighth particular profile 800H includes an oval profile 820. Foci lengths of the oval profile 820 may be dictated by the arrangement and characteristics of an integrated diffuser.

To generate the first particular profile 800A, the second particular profile 800B, and the seventh profile 800G, refractive optics and/or diffractive optics may be integrated with one or more of the integrated diffusers 110, 210, 310, 410, 411, and 610A-610C described elsewhere in this disclosure. In these embodiments, the refractive optics and/or the diffractive optics may be aligned relative to the optical element 104 with precision.

With combined reference to FIGS. 2A-8H, the light sources (e.g., 100, 200, 300, 400A, 400B, and 600A-600C) described in this disclosure may be configured for various applications. In particular, the particular profile may be configured to illuminate a particular volume in the far field or portion of the particular volume. For example, the light sources (e.g., 100, 200, 300, 400A, 400B, and 600A-600C) may be implemented in various applications such as a night vision illuminator, an IR illuminator, a parking sensor, a driver alertness sensor, another sensor, or a similar application. In the various applications the light sources (e.g., 100, 200, 300, 400A, 400B, and 600A-600C) may be substituted for an existing light source currently in these applications that may be similar to the light source 50 of FIG. 1.

Figure 9:
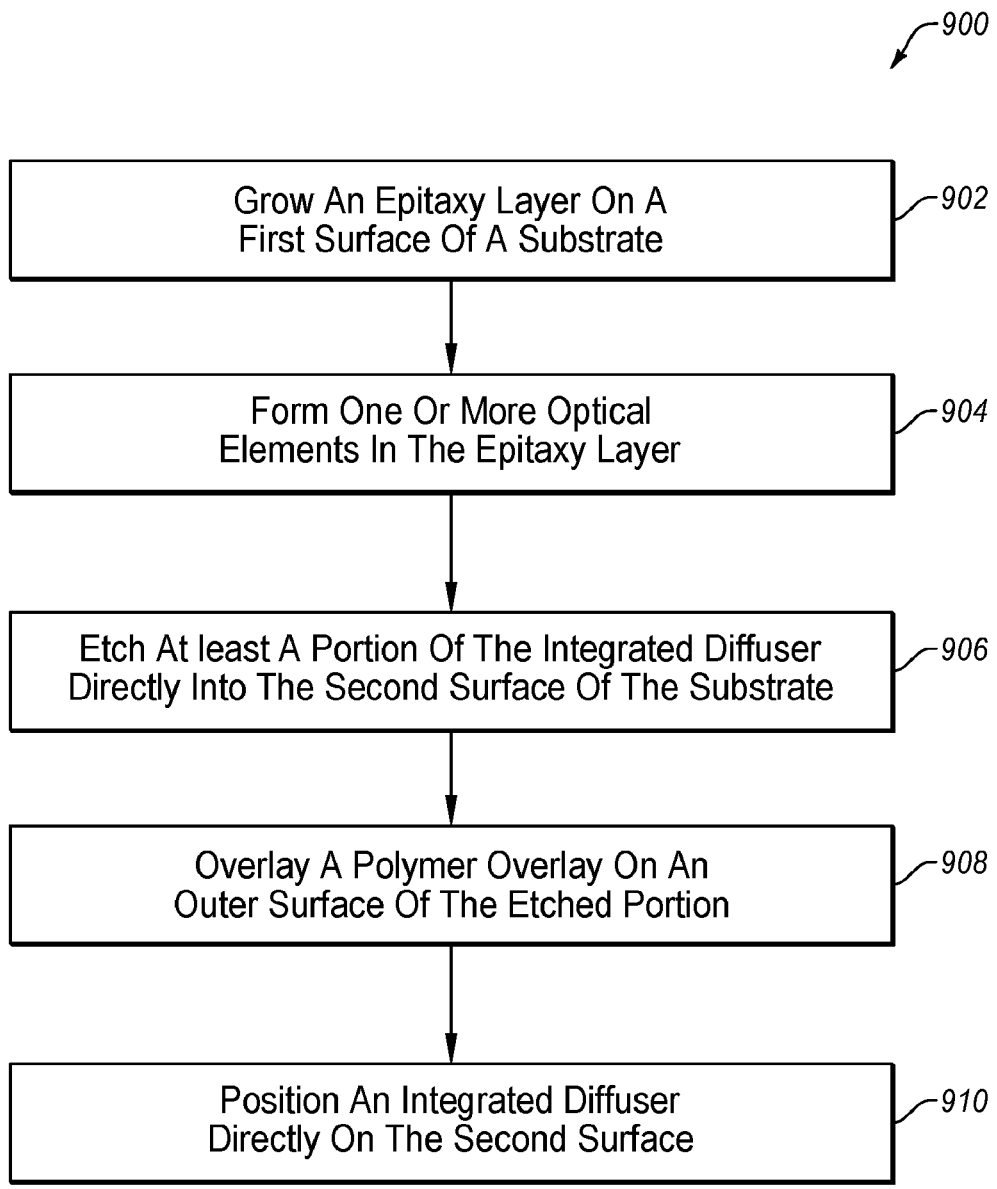
FIG. 9 is a flow chart that depicts an example method of chip-level diffuser integration in a light source.

FIG. 9 is a flow chart of an example method 900 of chip-level integration of a diffuser in a light source according to at least one embodiment described in the present disclosure. Although illustrated as discrete blocks, various blocks in FIG. 900 may be divided into additional blocks, combined into fewer blocks, or eliminated, depending on the desired implementation.

The method 900 may begin at block 902 in which an epitaxy layer may be grown. The epitaxy layer may be grown on a first surface of a substrate. The substrate may include the first surface and a second surface that is opposite the first surface. At block 904, one or more optical elements may be formed in the epitaxy layer. The one or more optical elements may be formed in the epitaxy layer such that optical signals transmitted by the one or more optical elements propagate through the substrate in a direction towards the second surface.

At block 906, at least a portion of an integrated diffuser may be etched directly into the second surface of the substrate. For example, the integrated diffuser may be etched using wet etching, plasma etching or another suitable type of etching. At block 908, a polymer overlay may be overlaid. The polymer overlay may be overlaid on an outer surface of the etched portion of the integrated diffuser. In some embodiments, block 908 or any other block may be skipped.

At block 910, the integrated diffuser may be positioned directly on the second surface. The integrated diffuser may be positioned on the second surface such that the integrated diffuser is configured to receive the transmitted optical signals directly from the substrate after the optical signal propagates through the substrate and to control a particular profile of a resultant beam of the optical signal after the optical signal propagates through the integrated diffuser.

One skilled in the art will appreciate that, for this and other procedures and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the disclosed embodiments.

Figure 10:
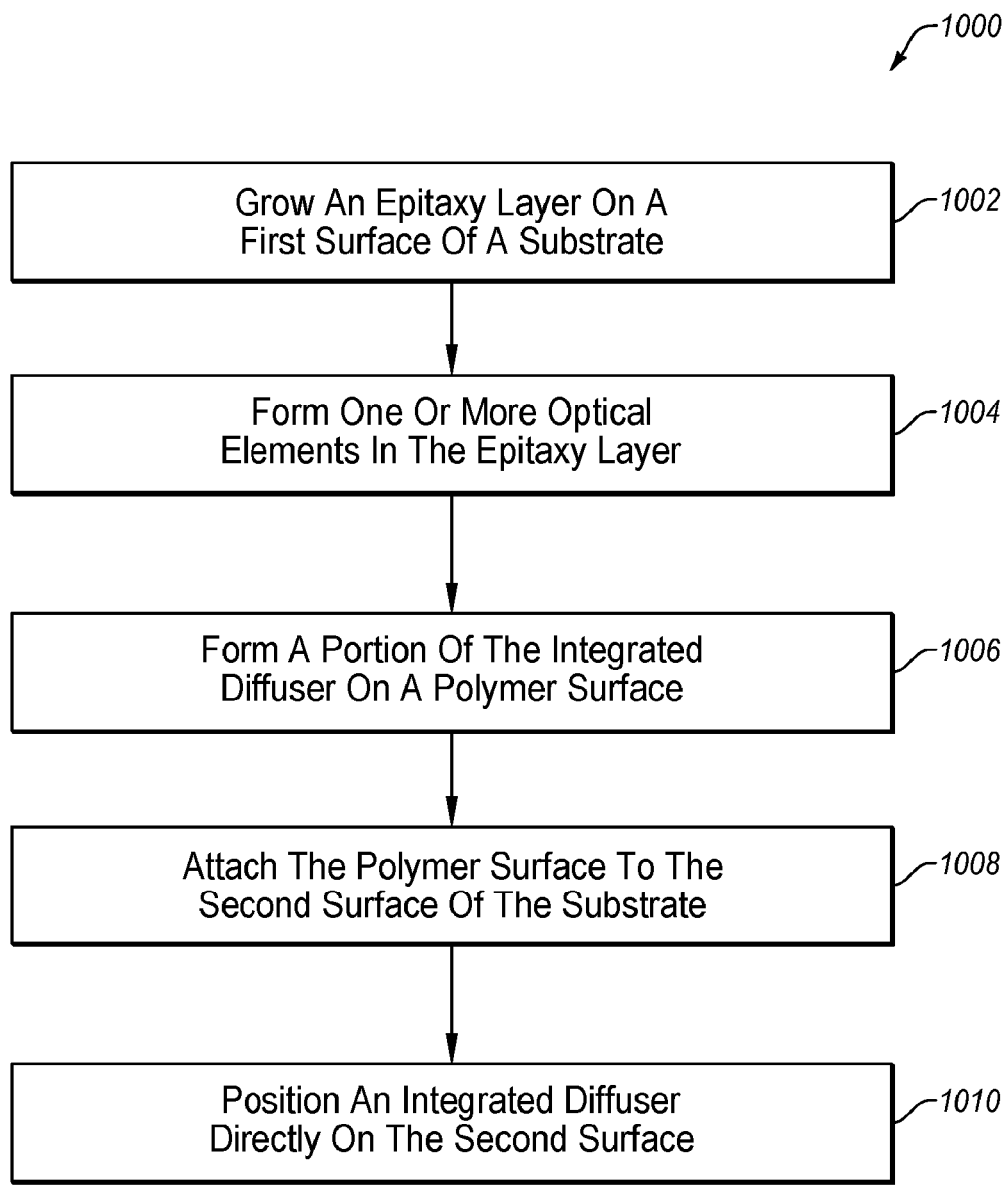
FIG. 10 is a flow chart that depicts another example method of chip-level diffuser integration in a light source.

FIG. 10 is a flow chart of an example method 1000 of chip-level integration of a diffuser in a light source according to at least one embodiment described in the present disclosure. Although illustrated as discrete blocks, various blocks in FIG. 10 may be divided into additional blocks, combined into fewer blocks, or eliminated, depending on the desired implementation.

The method 1000 may begin at block 1002 in which an epitaxy layer may be grown. The epitaxy layer may be grown on a first surface of a substrate. The substrate may include the first surface and a second surface that is opposite the first surface. At block 1004, one or more optical elements may be formed in the epitaxy layer. The one or more optical elements may be formed in the epitaxy layer such that optical signals transmitted by the one or more optical elements propagate through the substrate in a direction towards the second surface.

At block 1006, at least a portion of the integrated diffuser may be formed on a polymer surface. At block 1008, the polymer surface may be attached to the second surface of the substrate. In some embodiments, the integrated diffuser may be comprised of an ultra violet (UV) curable polymer. In these and other embodiments, the integrated diffuser may be generated using a master UV stamp, for instance. Additionally, in some embodiments, the integrated diffuser may be comprised of a thermoplastic. In these and other embodiments, the integrated diffuser may be generated using a heated stamp that melts a surface of the thermoplastic.

At block 1010, the integrated diffuser may be positioned directly on the second surface. The integrated diffuser may be positioned on the second surface such that the integrated diffuser is configured to receive the transmitted optical signals directly from the substrate after the optical signal propagates through the substrate and to control a particular profile of a resultant beam of the optical signal after the optical signal propagates through the integrated diffuser.

Unless specific arrangements described herein are mutually exclusive with one another, the various implementations described herein can be combined to enhance system functionality or to produce complementary functions. Likewise, aspects of the implementations may be implemented in standalone arrangements. Thus, the above description has been given by way of example only and modification in detail may be made within the scope of the present invention.

With respect to the use of substantially any plural or singular terms herein, those having skill in the art can translate from the plural to the singular or from the singular to the plural as is appropriate to the context or application. The various singular/plural permutations may be expressly set forth herein for sake of clarity. A reference to an element in the singular is not intended to mean "one and only one" unless specifically stated, but rather "one or more." Moreover, nothing disclosed herein is intended to be dedicated to the public regardless of whether such disclosure is explicitly recited in the above description.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, or A, B, and C together, etc.). Also, a phrase presenting two or more alternative terms, whether in the description, claims, or drawings, should be understood to include one of the terms, either of the terms, or both terms. For example, the phrase "A or B" will be understood to include the possibilities of "A" or "B" or "A and B."

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A light source, comprising:
a substrate having first and second surfaces opposite to one another;
an optical element positioned at the first surface and being configured to transmit an optical signal through the substrate; and
a diffuser positioned at the second surface and being configured to receive the optical signal, the diffuser having a plurality of lenslets arranged in a pseudorandom distribution,
wherein the plurality of lenslets comprise first portions and second portions,
wherein the first portions are positioned on the second surface and the second portions are positioned on the first portions, and
wherein the first portions and the second portions have complementary optical effects.

2. The light source of claim 1, wherein the first portions of the plurality of lenslets are positioned directly on the second surface of the substrate.

3. The light source of claim 1, wherein the first portions of the plurality of lenslets are etched directly into the second surface of the substrate.

4. The light source of claim 3, wherein the second portions of the plurality of lenslets comprise a polymer overlay positioned over the first portions of the plurality of lenslets.

5. The light source of claim 1, wherein the second portions of the plurality of lenslets are formed in a polymer coupled to the second surface of the substrate.

6. The light source of claim 1, wherein at least one of the plurality of lenslets is diffractive, and wherein at least one of the plurality of lenslets is refractive.

7. The light source of claim 1, wherein the complementary optical effects include a first refractive index associated with the first portions and a second refractive index associated with the second portions that is different from the first refractive index.

8. The light source of claim 7, wherein the second portions are formed by a polymer attached to the first portions.

9. The light source of claim 7,
wherein the substrate has the first refractive index, and
wherein the first portions are etched directly into the second surface of the substrate.

10. The light source of claim 9, wherein the second portions comprise a polymer overlay positioned over the first portions.

11. The light source of claim 1,
wherein the complementary optical effects include a first diffusion direction associated with the first portions, and a second diffusion direction associated with the second portions, and
wherein the second diffusion direction is different from the first diffusion direction.

12. The light source of claim 1, wherein the plurality of lenslets are configured to control a particular profile of a resultant beam after the optical signal propagates through the diffuser over a first dimension in a first direction aligned with a first of two axes and over a second dimension in a second direction aligned with a second of the two axes.

13. The light source of claim 1, wherein the plurality of lenslets comprise two or more pseudorandom focal lengths.

14. The light source of claim 1,
wherein the plurality of lenslets comprise two or more different focal lengths, and
wherein the plurality of lenslets with the two or more different focal lengths are arranged in the pseudorandom distribution.

15. The light source of claim 1,
wherein the substrate comprises an epitaxy layer positioned on the first surface of the substrate, and
wherein the optical element is formed in the epitaxy layer.

16. The light source of claim 15, wherein the optical element comprises one of a backside emitting optical source a substrate-emitting vertical-cavity surface-emitting laser (VCSEL), and an array of substrate-emitting VCSELs arranged in a non-repeating and non-symmetric pattern.

17. The light source of claim 1, wherein the optical element is not in alignment with the diffuser.

18. The light source of claim 1,
wherein the optical element positioned at the first surface is integrated at chip-level at the first surface, and
wherein the diffuser positioned at the second surface is integrated at chip-level at the second surface.

19. A method, comprising:
transmitting an optical signal from an optical element positioned at a first surface of a substrate;
passing the optical signal through the substrate toward a second surface of the substrate opposite to the first surface;
propagating the optical signal through a diffuser positioned at the second surface of the substrate; and
controlling a particular profile of a resultant beam of the optical signal after the optical signal propagates through the diffuser by diffracting or refracting the optical signal with a plurality of lenslets arranged in a pseudorandom distribution on the diffuser,
wherein the plurality of lenslets comprise first portions positioned on the second surface and second portions positioned on the first portions,
wherein the first portions and the second portions have complementary optical effects.

20. A method of forming a light source, the method comprising:
forming an optical element at a first surface of a substrate, the optical element being configured to transmit an optical signal through the substrate, the substrate having a second surface opposite the first surface; and
forming a diffuser to receive the optical signal at the second surface of the substrate by arranging a plurality of refractive or diffractive lenslets of the diffuser in a pseudorandom distribution to control a particular profile of a resultant beam of the optical signal after the optical signal propagates through the diffuser,
wherein the plurality of refractive or diffractive lenslets comprise first portions and second portions, and
wherein the first portions are positioned on the second surface, the second portions are positioned on the first portions, and the first portions and the second portions have complementary optical effects.

21. The method of claim 19, wherein the complementary optical effects include diffusion of the optical signal in a first diffusion direction associated with the first portions, and diffusion of the optical signal in a second diffusion direction associated with the second portions, and
wherein the second diffusion direction is different from the first diffusion direction.

22. The method of claim 20, wherein the complementary optical effects include diffusion of the optical signal in a first diffusion direction associated with the first portions, and diffusion of the optical signal in a second diffusion direction associated with the second portions, and
   wherein the second diffusion direction is different from the first diffusion direction.

\* \* \* \* \*